United States Patent [19]

Magdo et al.

[11] 4,256,532
[45] Mar. 17, 1981

[54] METHOD FOR MAKING A SILICON MASK

[75] Inventors: Ingrid E. Magdo; Steven Magdo, both of Hopewell Junction, N.Y.

[73] Assignee: International Business Machines Corporation, Armonk, N.Y.

[21] Appl. No.: 966,303

[22] Filed: Dec. 4, 1978

Related U.S. Application Data

[63] Continuation of Ser. No. 812,941, Jul. 5, 1977, abandoned.

[51] Int. Cl.³ .............................................. B44G 1/22
[52] U.S. Cl. ................................. 156/628; 156/643;
156/644; 156/657; 156/662; 204/192 E;
118/504; 428/134; 428/137; 428/156
[58] Field of Search ............... 427/96, 88, 91, 282,
427/94; 204/192 E, 192 N; 118/504; 156/632,
657, 662; 428/134, 137, 156

[56] References Cited

U.S. PATENT DOCUMENTS

| | | | |
|---|---|---|---|
| 3,226,255 | 12/1965 | Cieniewicz | 427/82 |
| 3,544,790 | 12/1970 | Brown | 250/452 |
| 3,640,782 | 2/1972 | Brown | 148/187 |
| 3,647,533 | 3/1972 | Hicks | 118/505 |
| 3,713,922 | 1/1973 | Lepselter | 96/36.2 |
| 3,723,201 | 3/1973 | Keil | 148/175 |
| 3,896,606 | 7/1975 | Cappelow | 156/657 |
| 3,917,495 | 11/1975 | Horn | 148/187 |
| 3,928,094 | 12/1975 | Angell | 148/187 |
| 3,951,701 | 4/1976 | Csillag | 148/187 |
| 4,021,276 | 5/1977 | Cho | 428/134 |
| 4,049,857 | 9/1977 | Hammer | 427/282 |

OTHER PUBLICATIONS

Huarg, Schottky Devices ... Membranes, *IEEE Transactions on Electron Devices,* vol. ED-23, No. 6, (579–583), 1976.

*Primary Examiner*—Ronald H. Smith
*Assistant Examiner*—Richard Bueker
*Attorney, Agent, or Firm*—Robert J. Haase

[57] ABSTRACT

In the fabrication of semiconductor integrated circuits, a method is provided for forming a self-supporting silicon mask and a further method is provided for utiliziing such a self-supporting separable silicon mask to perform various masking steps in the integrated circuit fabrication.

The mask is formed by forming, at a surface of a planar silicon substrate, a silicon layer having a higher concentration of conductivity-determining impurities than the substrate beneath the layer, applying to selected portions of the other surface of the substrate an etchant which preferentially etches silicon having lower concentrations of conductivity-determining impurities to thus etch out preferentially selected portions of the substrate to form at least one recess extending through the substrate to said silicon layer, and then etching from the surface of said silicon layer opposite the substrate recess to form patterns of openings extending through the silicon layer to said substrate recess.

The seperable self-supporting silicon mask thus formed is then placed on the surface of an integrated semiconductor circuit member so that the opposite surface of the silicon layer interfaces with the integrated circuit member surface. Then, the masked semiconductor member may be subjectd to any conventional integrated circuit fabrication step which alters the characteristics of the portions of said member surface exposed in said pattern of mask openings; such fabrication steps include introduction of impurities, etching as well as lift-off deposition of metallic and non-metallic patterns. Upon the completion of the step or steps, the self-supporting silicon mask is separated from the integrated circuit member.

7 Claims, 12 Drawing Figures

METHOD FOR MAKING A SILICON MASK

This is a continuation of application Ser. No. 812,941 filed July 5, 1977, now abandoned.

BACKGROUND OF THE INVENTION

The present invention relates to a method for fabricating integrated circuits. More particularly, it relates to a novel method for forming a self-supporting separable silicon mask and for utilizing such a silicon mask in the fabrication of integrated circuits.

Integrated circuits are conventionally formed by photolithographic fabrication techniques wherein a photoresist pattern must be formed on the integrated circuit substrate prior to virtually every fabrication step involving the definition of a particular lateral pattern on the substrate. The photoresist defines various metallic patterns formed during the fabrication by photolithographic etching or, similarly, it is used to form the pattern in the insulative layers or barrier layers used to limit the introduction of conductivity-determining impurities into the substrate or to limit areas of electrical insulation.

The fabrication of any standard large scale integrated circuit at the level of present technology requires dozens of such photolithographic masking steps. Each of said steps is complex in that it first involves the formation of a separable mask through which the photoresist layer is exposed, e.g., a conventional metal glass mask, followed by exposure of the photoresist to light through this mask and then development of the photoresist. In addition, each of such photoresist exposure steps requires a rather difficult alignment of the glass mask with the substrate. Part of the difficulty for such an alignment is that the alignment must be made between an alignment indicating mark on the substrate and one on the underside of the glass mask. The image of these alignment indicators must pass through from 50 to 60 mils thickness of glass before reaching the alignment microscope objective lens. This substantial distance between the alignment mark and the objective lens gives rise to optical aberration in alignment. Also, the image of the substrate alignment indicator must pass up through the photoresist layer covering the substrate which results in some aberration due to dispersion of light within the photoresist.

It would, thus, be desirable to have a method of integrated circuit fabrication wherein the utilization of photolithographic techniques were eliminated, and each of the integrated circuit fabrication steps could instead be performed with a separable mask which would serve to define the lateral geometries involved in that particular step. Silicon would be a desirable material for such separable masks in that it would have an identical thermal coefficient of expansion with the substrate and, thus, there would be no mask distortion during integrated fabrication steps requiring the application of heat.

In this respect, the use of silicon masks in the fabrication of integrated circuit elements by ion implantation has been disclosed in U.S. Pat. No. 3,713,922, Lepselter et al. However, such mask structures have relatively small utilizable masking portions or windows of thin silicon with a substantial portion of the mask being occupied by the array of thick silicon supporting ribs. As set forth in this patent, the windows of thin silicon (1 micron in thickness) have lateral dimensions of 50 to 500 microns and are supported by an array of ribs about 1 mil or 25 microns in thickness.

However, since standard large scale integrated circuits require chips having lateral dimensions in the order of 1250 microns to 12,500 microns and even greater, the structures shown in the patent do not appear to be capable of providing silicon masks with thin portions having corresponding dimensions in the order of from 1250 to 12,500 microns so that each window can mask a whole chip.

SUMMARY OF THE PRESENT INVENTION

Accordingly, it is a primary object of the present invention to provide a method for producing self-supporting separable silicon masks which are utilizable in the fabrication of large scale integrated circuits.

It is another object of the present invention to provide a method for fabricating silicon masks utilizable to replace conventional photolithographic masks in the fabrication of large scale integrated circuits.

It is yet another object of the present invention to provide a method for fabricating large scale integrated circuits utilizing silicon masks instead of photolithographic masks.

It is a further object of the present invention to provide a novel method for producing metallization patterns in integrated circuit fabrication by lift-off techniques.

In accordance with the present invention, in the fabrication of semiconductor integrated circuits, a method is provided for fabricating large scale integrated circuits with self-supporting silicon masks which comprises first forming such silicon masks by a process comprising forming, at the surface of a planar silicon substrate, a silicon layer having a higher concentration of conductivity-determining impurities than the substrate beneath the layer and then applying to selected portions of the other surface of said substrate an etchant which preferentially etches silicon having lower concentrations of conductivity-determining impurities to thus preferentially etch out selected portions of the substrate to form at least one recess extending through the substrate to said silicon layer. Then, by etching from the surface of the silicon layer opposite the substrate recess, a pattern of openings is formed extending through the silicon layer to at least one substrate recess. Preferably, the resulting masks contain a plurality of recesses separated from each other and supported by the unetched portions of the silicon substrate. It is desirable when used in large scale integrated circuit fabrication that the recesses be arranged in an array corresponding to the chips to be formed in a semiconductor wafer and the unetched portions of the silicon mask correspond to the wafer kerf.

The method of the present invention may be used to form silicon masks with thin silicon masking layers having chip-size recesses which with minimum lateral dimensions in the order of 1250 microns and preferably lateral dimensions in the order of 12,500 microns. In order for the mask to remain self-supporting, with such large lateral dimensions, even the thin layer of silicon preferably has a thickness of at least 3 microns and the unetched or rib portions of the silicon mask preferably has a thickness of from 5 to 15 mils (125–375 microns). In such cases, the initial silicon wafer from which the silicon mask is to be formed will have thicknesses in the order of from 5 to 15 mils. With such thick initial wafers, the recesses should be formed in accordance with the present invention by an anisotropic etching step which will minimize lateral etching while the vertical thickness of from 5 to 15 mils of silicon is etched through.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
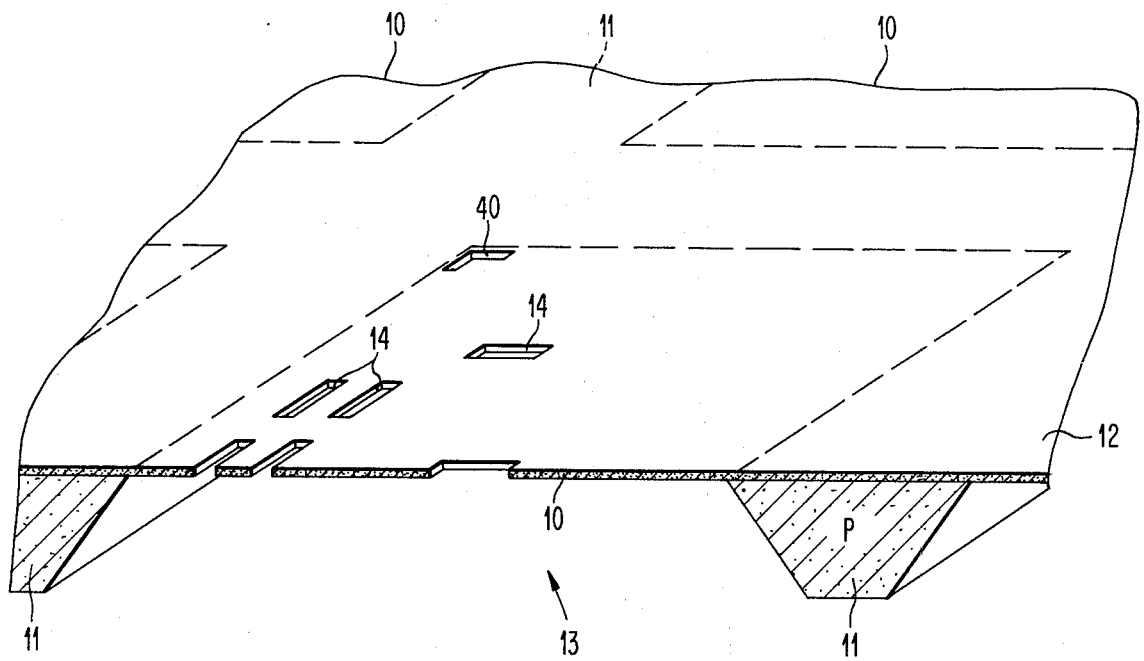
FIG. 1 is a partial perspective sectional view of a portion of the silicon mask of the present invention.
Figure 1A:
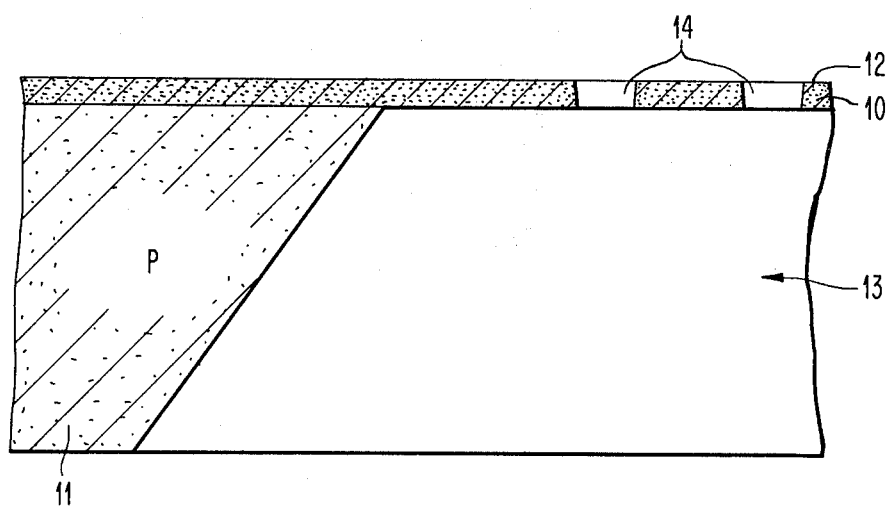
FIG. 1A is an enlarged sectional view of the portion of the mask indicated in phantom lines in FIG. 1.

FIGS. 1 and 1A show a portion of the silicon mask formed in accordance with the method of the present invention. The mask comprises thin portions of silicon 10 having lateral dimensions in the order of from 50 to 500 mils to substantially correspond in size to a chip in a wafer which is to be fabricated utilizing a series of masks like that shown in FIGS. 1 and 1A. Between the thin silicon portions 10, the mask has thicker supporting portions 11 which preferably correspond to the kerf area in the integrated circuit wafer on which the mask is to be used. Thin silicon layer 10 has a thickness preferably in the order of from 3 to 5 microns while the thickness of the thicker supporting portions or ribs 11 is in the order of from 5 to 15 mils. As will be hereinafter described in greater detail, the surface 12 of the mask which is substantially planar is placed in contact with the integrated circuit to be fabricated while the various fabrication operations which utilize the masks are performed by accessing thin mask layer 10 through recesses 13. Apertures 14 in thin silicon layer 10 serve to define the lateral geometry of the various operations in the fabrication of integrated circuit to be carried out using the present mask. These operations include, among others, ion implantation, etching of the silicon substrate or metallic or insulative layers on the substrate, as well as the formation of metallic patterns or patterns of electrically insulative material on the substrate through the mask by lift-off techniques.

Now with reference to FIGS. 2A–2E, there will be described the preferred method for fabricating the mask of the present invention. The fabrication method of the silicon mask utilizes a series of photolithographic masking steps which will not be described in extensive detail because they are well within the knowledge of the integrated circuit masking art. Details of any of such photolithographic masking and fabrication steps may be obtained from representative U.S. Pat. Nos. 3,539,876 or 3,904,454, or from the text, "Integrated Circuits, Design Principles and Fabrication", R. M. Warner et al, McGraw Hill Book Company, New 1965.

Figure 2A:
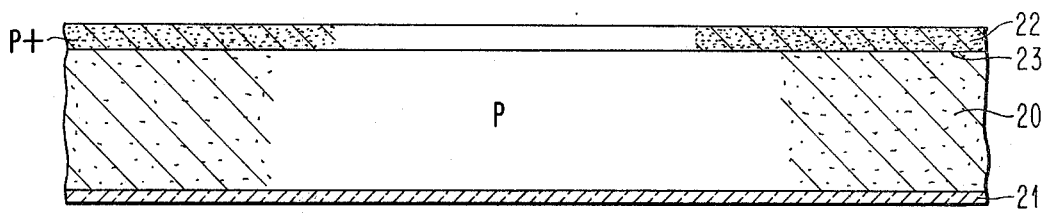
FIGS. 2A–2E are diagrammatic cross-sectional views of a portion of the mask structure during fabrication in accordance with the preferred embodiment of the present invention.

As shown in FIG. 2A, an initial P-type silicon wafer 20 having a sheet resistivity of 10 ohm-cm and cut in the <100> crystallographic plane is subjected to a thermal oxidation to grow a thermal layer 21 of silicon dioxide about 5,000 Å in thickness which will serve as a diffusion blocking mask. Then, the wafer is subjected to a blanket boron capsule diffusion of about sixty-four hours at 1100° C. to produce the P+ silicon layer 22 having a $C_0$ of $3 \times 20$ atoms/cm² and a doping level at interface 23 of $7 \times 10^{19}$ atoms/cm².

Figure 2B:
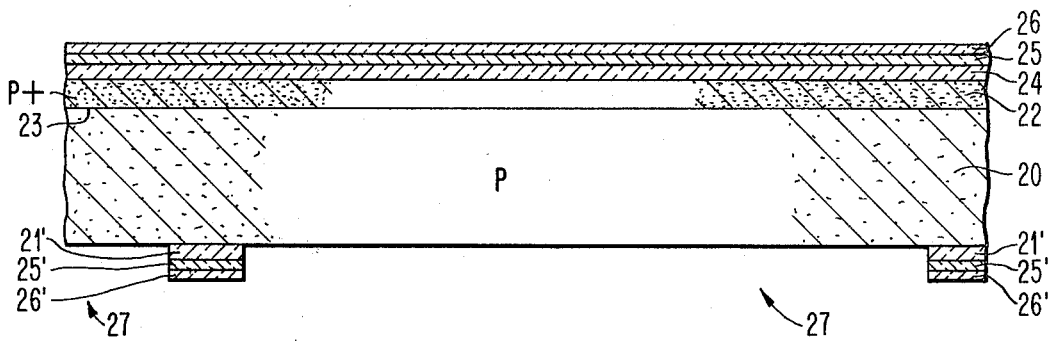
Figure 2C:
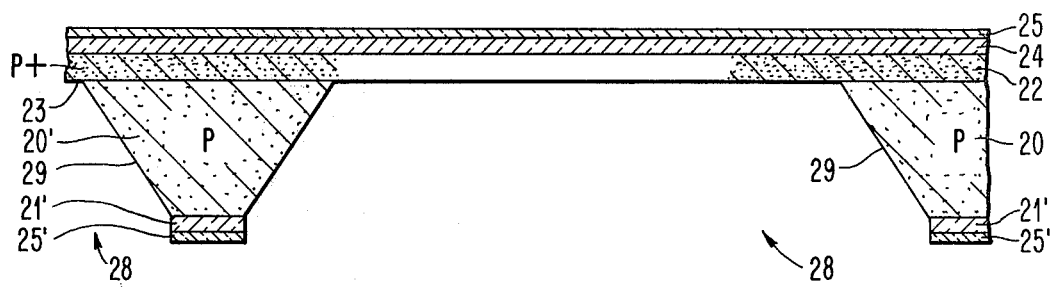

Next, FIG. 2B, a layer of silicon dioxide 24, about 5,000 Å in thickness is formed over P+ silicon layer 22. It should be noted that P+ layer 22 is about 5 microns in thickness. Where, as in the present example, P+ layer 22 which is subsequently to become the thin portion of the silicon mask is in the order of 5 microns or less in thickness, silicon dioxide layer 24 should be formed by a method other than thermal growth. Otherwise, the thin silicon portion of the mask which is formed from layer 22, particularly when it has large lateral dimensions in the order of from 50 to 500 mils on a side will be subject to some distortion. Consequently, silicon dioxide layer 24 is preferably deposited by a non-thermal-growth technique such as conventional sputter deposition or chemical vapor deposition.

Next, a layer of silicon nitride 25, 1,000 Å in thickness, and a layer of silicon dioxide 26, also 1,000 Å in thickness, is deposited in the conventional manner. Simultaneously, silicon nitride layer 25' and silicon dioxide layer 26' are deposited on the bottom silicon dioxide layer 21, and utilizing conventional photolithographic etching techniques, a composite mask is formed of layers 21', 25' and 26' on the bottom of substrate 20. The apertures 27 in this mask serve to define the pattern of recesses 28 which are to be formed, step 2C, in the substrate.

Recesses 28 are formed in substrate 20 by an anisotropic etching technique which will selectively etch through the more lightly doped P substrate 20 and essentially stop at the lower surface 23 of P+ layer 22. The anisotropic etching will serve to minimize the undesirable lateral etching which would otherwise be quite substantial when etching through a silicon substrate having a thickness of from 5 to 15 mils. The anisotropic etching step to produce recesses 28 is conducted using a composition of ethylene diamine, pyrocatechol and water. Operable, proportions for one such composition would be, for example, 25 ml of ethylene diamine, 4 g pyrocatechol and 8 ml of water carried out at 118° C. with $N_2$ bubbling through the solution to prevent oxidation. This composition will selectively etch silicon lightly doped with boron such as substrate 20 while silicon lightly doped with boron such as layer 22 will remain substantially unaffected. Since this composition will etch so that the remaining masked silicon ribs 20' will make an angle 29 of 54.7° with the horizontal when the silicon has a <100> crystallographic orientation, then undesirable lateral etching will be quite limited.

Details for etching with the ethylene diamine-pyrocatechol-water composition are set forth in *IEEE Transactions on Electronic Development*, Volume ED23, No. 6, June 1976, pp. 579-583.

Figure 2D:
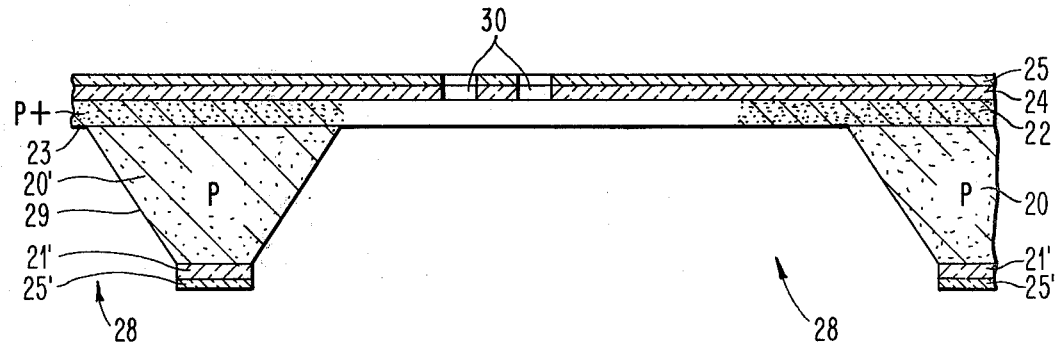

Then, FIG. 2D, a pattern of openings 30 are formed through silicon nitride layer 24 and silicon dioxide layer 25 in the conventional manner utilizing integrated circuit photolithographic fabrication techniques. The pattern of openings 30 will correspond to the pattern of openings to be fabricated in the silicon mask. Then, FIG. 2E, the corresponding pattern of openings 31 is etched through thin silicon layer 22. Openings 31 may be etched through thin silicon layer 22 utilizing conventional integrated circuit silicon etching techniques such as a composition of diluted hydrofluoric acid and nitric acid. However, since the silicon layer 22 which must be etched through is relatively thick, i.e., in the order of from 3 to 5 microns, it is desirable to minimize lateral etching. Accordingly, it is preferable to etch openings 31 through silicon layer 22 by sputter etching, utilizing conventional sputter etching apparatus and methods such as those described in U.S. Pat. No. 3,598,710 and particularly sputter etching carried out utilizing reactive gases. U.S. Pat. No. 3,471,396 sets forth a listing of inert or reactive gases or combinations thereof which may be used in sputter etching. One preferable reactive sputter etching ambient would be a $Cl_2$ plasma.

Figure 2E:
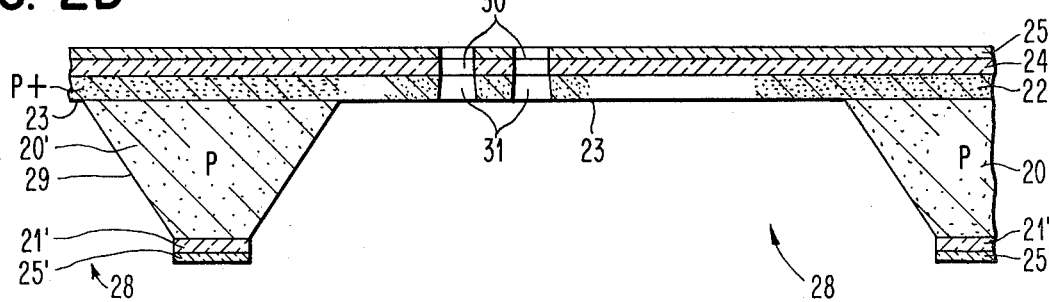

For best results, in the practice of the present invention, it is preferable that openings 31 be etched by etching from surface 32 of layer 22 as shown in FIG. 2E rather than by etching from lower surface 23 of layer 22. The etching as shown in FIG. 2E will produce an opening 31 whose sides have a slope tapering about 5° toward the bottom of the openings. As will be seen hereinafter in the descriptions with respect to FIGS. 5 and 6A, such a slope is particularly desirable as it provides a negative slope or lip when the mask is used for a lift-off step in the fabrication of metallic and other patterns on the substrate.

In any event, upon the completion of the formation of the pattern of openings 31 in FIG. 2E, silicon dioxide layers 21' and 24 and silicon nitride layers 25 and 25' are desirably removed to leave the self-supporting silicon mask in which the pattern of openings 31 correspond to a particular lateral pattern to be defined in the integrated circuit being fabricated at a particular step which may involve introduction of impurities into the substrate, etching of metallic or insulative layer or silicon substrate patterns in the integrated circuit, selective oxidation of the substrate, or deposition of metallization or insulative patterns on the substrate by lift-off techniques. Representative examples of some of these techniques wherein the silicon mask of the present invention is used in integrated circuit fabrication will now be described.

Figure 3:
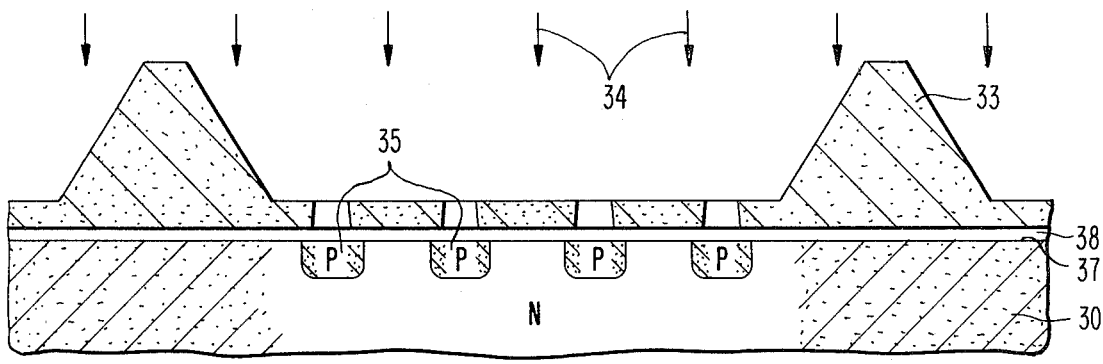
FIG. 3 is a diagrammatic sectional view illustrating the use of the mask of the present invention in an ion implantation step in integrated circuit fabrication.

With reference to FIG. 3, silicon mask 33 is shown being used as a barrier to ion beam 34 during the implantation of positive boron ions to form P regions 35 in N substrate 36. Mask 33 is flush against surface 37 of substrate 36. However, even in such a flush contact, due to standard planar surface irregularities a space 38 about 4,000 to 10,000 Å in thickness would normally separate the substrate from the mask 33. Because of this substantially flush contact, alignment of alignment marks on the mask such as L-shaped alignment mark 40 in FIG. 1 with the substrate by optical means would be greatly facilitated since the alignment mark is at most a few microns from a corresponding alignment indicator on the substrate (not shown). Also, with this arrangement, all of the mask alignment problems inherent in the alignment of photoresist masks in photolithographic integrated circuit fabrication as set forth in the Background of The Invention hereinabove are mitigated or solved. As a result, with the silicon masks of the present invention, alignment tolerances in the order of ±0.5 microns with respect to the substrate should be possible as compared with the alignment tolerances of ±2 microns with conventional photoresist masking alignment. Accordingly, ion implanted resistors such as implanted resistors 35 in FIG. 3 are subject to less variation in width ane resistors with very close parametric tolerances may be produced.

Figure 4:
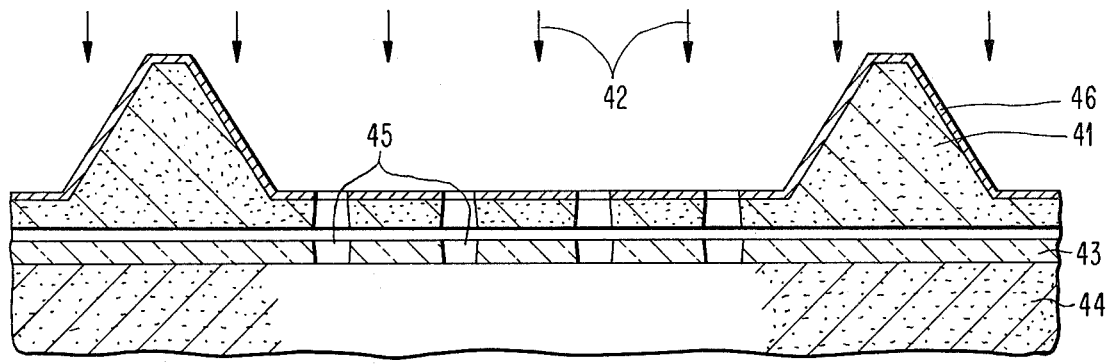
FIG. 4 is a diagrammatic sectional view of the mask of the present invention during its use as an etch barrier mask during an etching step in the fabrication of integrated circuits.

Referring now to FIG. 4, silicon mask 41 is being utilized as a sputter etching mask during a sputter etching operation with an RF sputtering system in which the ions 42 including reactive ions are applied to an insulative layer 43 on a integrated circuit substrate 44 to etch a plurality of openings 45 through this insulative layer. The RF sputtering system with reactive ions may be the same conventional system described hereinabove with respect to the fabrication of the silicon masks. When the silicon mask is used as a mask in such an RF sputtering system particularly with reactive ions, it has been found to be desirable to coat the silicon mask with a thin layer 46 in the order of 2,000 Å of a protective metal such as aluminum. This may be conveniently done after the protective layers of insulative material used in connection with the mask opening step in FIG. 2E have been removed.

Figure 5:
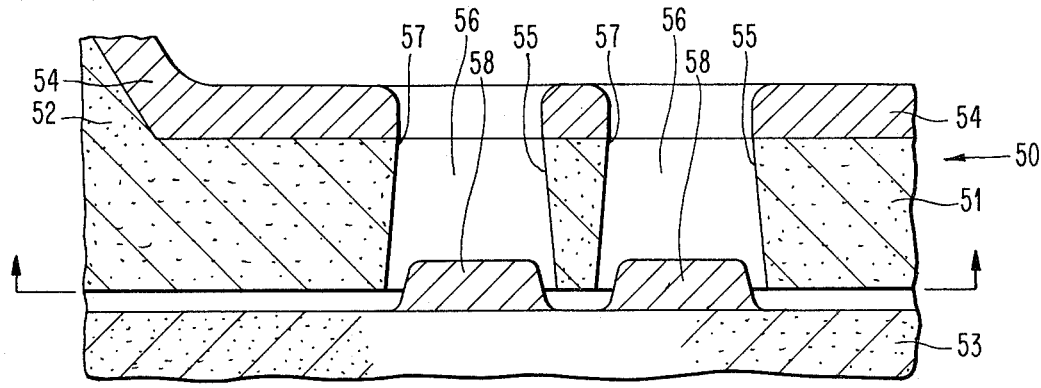
FIG. 5 is a diagrammatic sectional view of the mask of the present invention during its use as a lift-off barrier mask during the deposition of metallization patterns in the fabrication of integrated circuits.

The self-supporting silicon mask of the present invention offers a valuable expedient in the fabrication of integrated circuits involving processing steps where patterns of either electrically insulative material or metal are deposited on a substrate through the apertures in a mask and then the mask is lifted off to remove the excess material. Such a step is shown in FIG. 5. The partial section of silicon mask 50 comprises thin portions 51 and thick portions or supporting mask ribs 52. Mask 51 is placed in contact with the substrate 53 on which a metallization pattern is to be formed and a blanket deposition of metal such as aluminum layer 54 is applied over the entire masked substrate. Because as previously described, the sides 55 of openings 56 in the mask have a slight negative slope which provides a mask overhang or lip 57 at the edge of mask apertures 56, we have the expedient recognized in the lift-off technology as necessary to prevent the metal pattern 58 deposited in the openings from being continuous with the metal 54 deposited on the mask surface. With such discontinuity provided for, the mask 51 may be readily lifted-off carrying with it deposited aluminum blanket layer 54 and leaving the aluminum pattern 58 corresponding to the pattern of openings 56. Upon the completion of the step, metal layer 54 may be selectively removed from the mask 51 and the mask reused for the same operation on a different integrated circuit wafer.

Figures 6, 6A:
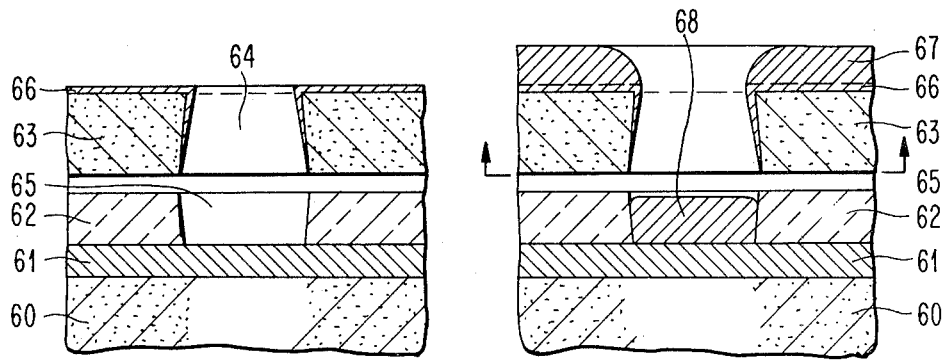
FIGS. 6 and 6A are diagrammatic cross-sectional views of the mask of the present invention as used in a combined integrated circuit fabrication procedure involving an etching step followed by a metal deposition step.

In FIGS. 6 and 6A, a portion of a silicon mask is shown to illustrate the use of the mask for a combination of steps, i.e., sputter etching of a substrate utilizing reactive ions followed by a deposition of the pattern of metal in sputter etched regions in the substrate. With reference to FIG. 6, a metallic layer 61 is formed on a substrate 60 and an insulative layer 62 is formed over the metallic layer. The silicon mask 63 is placed in contact with the insulative layer 62. For convenience in illustration, mask 63 represents only the thin portion of the mask abutting an aperture 64 in the mask. Then, FIG. 6, through the use of the sputter etching step utilizing reactive ions described above with respect to FIG. 4, a pattern of openings 65 corresponding to mask openings 64 are sputter etched through insulative layer 62 which may be a material such as silicon dioxide and extend to underlying metallic layer 61. For best results in such a sputter etching processing step, silicon mask 63 is preferably coated with a thin aluminum layer 66 as described in FIG. 4 prior to the use of the mask in the sputter etching step.

Next, FIG. 6A, the procedure of FIG. 5 is followed and metal is deposited to form a pattern of metallic conductors 68 in via holes 65 extending through insulative layer 62 to communicate with underlying metallic layer 61. The remainder of the blanket metal deposition 67 is removed by lifting-off silicon mask 63.

While the invention has been particularly shown and described with reference to the preferred embodiments thereof, it will be understood by those skilled in the art that various changes in form and details may be made therein without departing from the spirit and scope of the invention.

What is claimed is:

1. A method for fabricating a self-supporting silicon mask comprising:
    forming at a surface of a planar silicon substrate a silicon layer having a higher concentration of conductivity-determining impurities than the substrate beneath said layer,
    forming a masking layer on the surface of said silicon layer, said masking layer comprising a layer of chemical vapor deposited silicon dioxide and an overlying layer of silicon nitride in contact with said silicon layer surface,
    applying to selected portions of the other surface of said substrate an etchant comprising ethylene diamine, pyrocatechol and water which preferentially etches silicon having lower concentrations of conductivity-determining impurities to preferentially etch out the entire thickness of selected portions of said substrate to form at least one recess extending completely through said substrate to said silicon layer, each said recess having a lateral dimension in the order of 12,500 microns and said silicon remaining in said recesses having a thickness in the order of 5 microns, and
    forming a pattern of apertures through said masking layer and etching said silicon layer through said apertures to form a corresponding pattern of openings through said silicon layer to at least one substrate recess.

2. The method of claim 1 wherein said selected portions of said substrate are preferentially etched out to form a plurality of recesses separated from each other and supported by the unetched portions of said substrate.

3. The method of claim 2 wherein said etching of the silicon layer to form said pattern of openings is carried out by sputter etching.

4. The method of claim 3 wherein said sputter etching utilizes reactive ions.

5. The method of claim 2 wherein said mask recesses have minimum lateral dimensions of 1250 microns.

6. The method of claim 5 wherein said unetched portions of said mask are at least twenty-five times as thick as said silicon layer remaining in said mask recesses.

7. The method of claim 1 wherein said silicon substrate surface has a 100 crystallographic orientation, and
    said conductivity-determining impurity is boron.

* * * * *